(12) United States Patent
Högerl

(10) Patent No.: US 6,665,182 B2
(45) Date of Patent: Dec. 16, 2003

(54) MODULE UNIT FOR MEMORY MODULES AND METHOD FOR ITS PRODUCTION

(75) Inventor: Jürgen Högerl, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/185,245

(22) Filed: Jun. 27, 2002

(65) Prior Publication Data

US 2003/0012001 A1 Jan. 16, 2003

(30) Foreign Application Priority Data

Jun. 27, 2001 (DE) .......................................... 101 30 592

(51) Int. Cl.[7] ................................................ H05K 7/20
(52) U.S. Cl. ...................... 361/695; 361/690; 361/683; 361/721; 361/784; 361/785; 361/730; 361/736; 439/61; 312/223.2
(58) Field of Search ............................... 361/690, 694, 361/695, 721, 755, 784, 785, 796; 439/61; 165/80.3, 104.33; 174/16.1

(56) References Cited

U.S. PATENT DOCUMENTS

| | | | |
|---|---|---|---|
| 5,060,111 A | * 10/1991 | Takashima | ................. 361/695 |
| 5,095,407 A | 3/1992 | Kanezawa et al. | |
| 5,251,097 A | 10/1993 | Simmons et al. | |
| 5,301,089 A | * 4/1994 | Takashima | ................. 361/744 |
| 5,319,526 A | * 6/1994 | Takashima | ................. 361/788 |
| 5,341,509 A | * 8/1994 | Takashima | ................. 710/317 |
| 5,457,604 A | * 10/1995 | Ando | ................. 361/707 |
| 5,519,584 A | * 5/1996 | Siroky | ................. 361/789 |
| 5,716,220 A | * 2/1998 | Siroky | ................. 439/61 |
| 5,812,797 A | 9/1998 | Crane, Jr. et al. | |
| 5,834,843 A | 11/1998 | Mori et al. | |
| 5,903,432 A | * 5/1999 | McMahon | ................. 361/690 |

* cited by examiner

Primary Examiner—Boris Chervinsky
(74) Attorney, Agent, or Firm—Laurence A. Greenberg; Werner H. Stemer; Ralph E. Locher

(57) ABSTRACT

The invention relates to a module unit for memory modules and to a method for producing the module unit. A module unit of this type has at least one main module and submodules. The modules are arranged in a star-shaped manner and are arranged radially with their inner contact strips in slots of a central plug connector. The module unit has a substantially cylindrical housing, from which an outer contact strip of the main module protrudes.

18 Claims, 5 Drawing Sheets

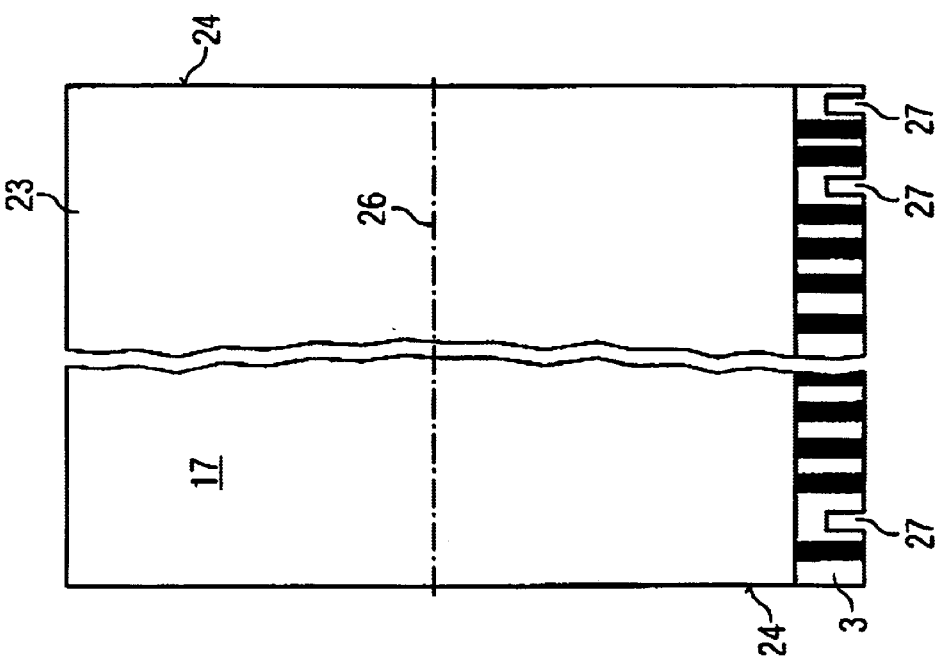
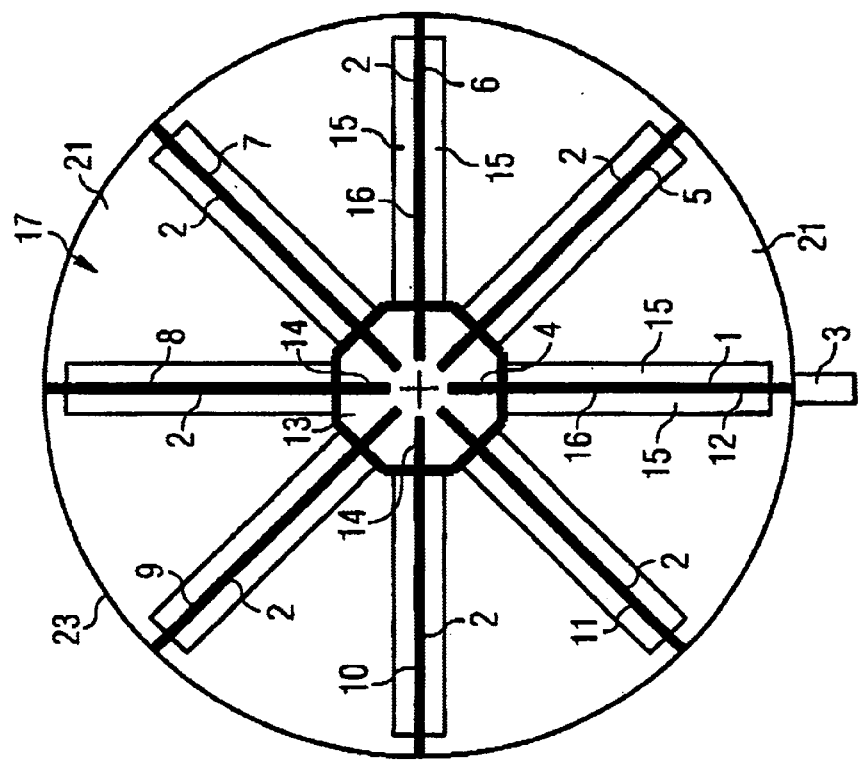

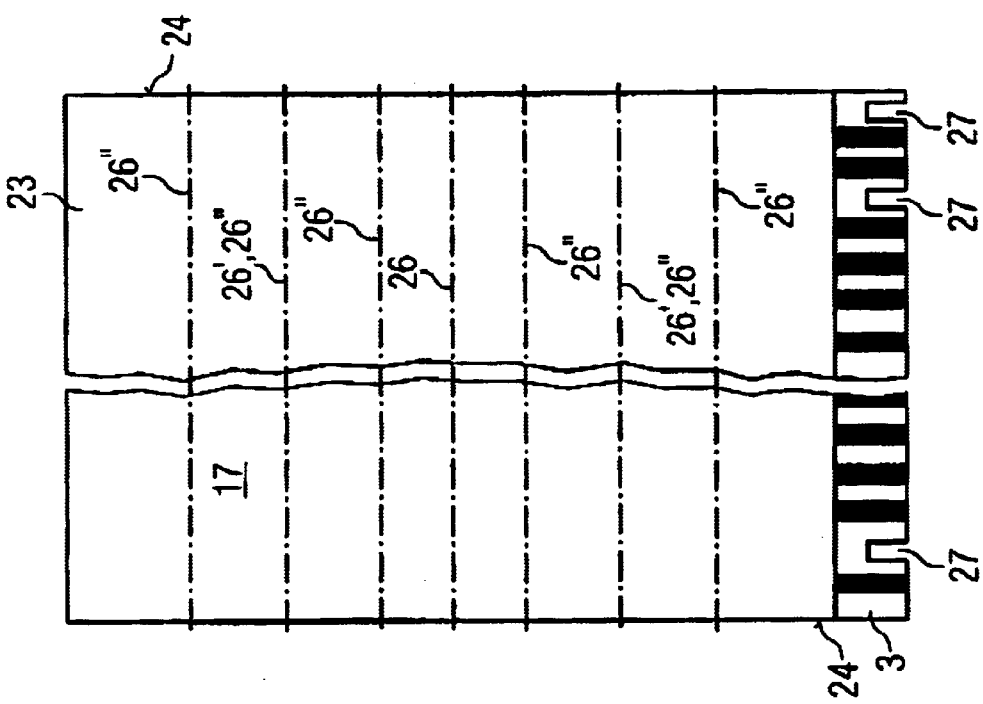
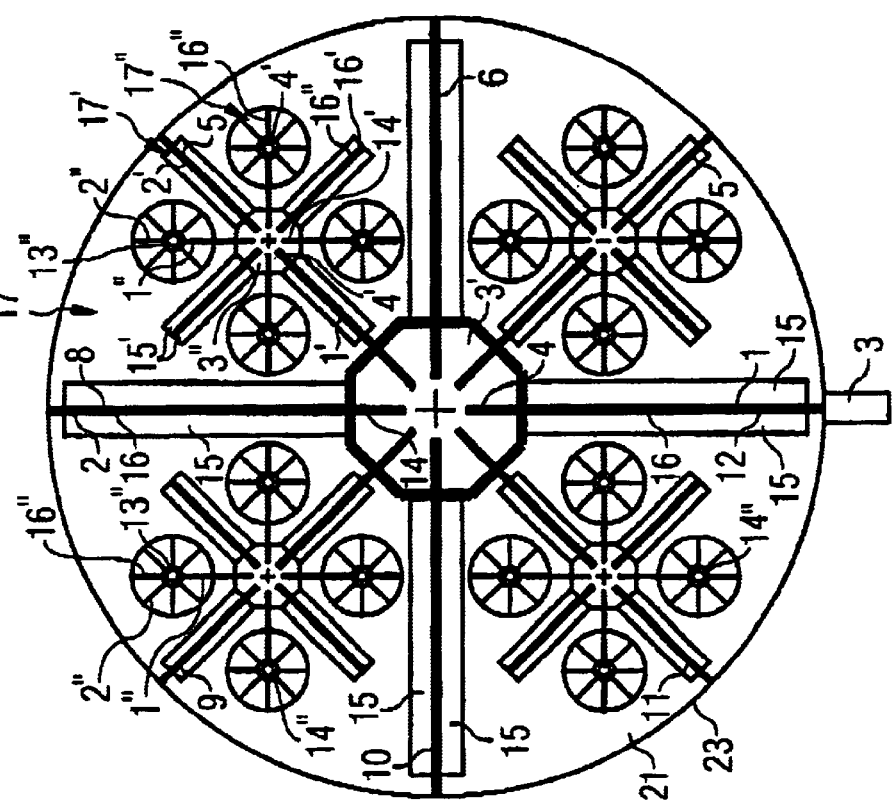

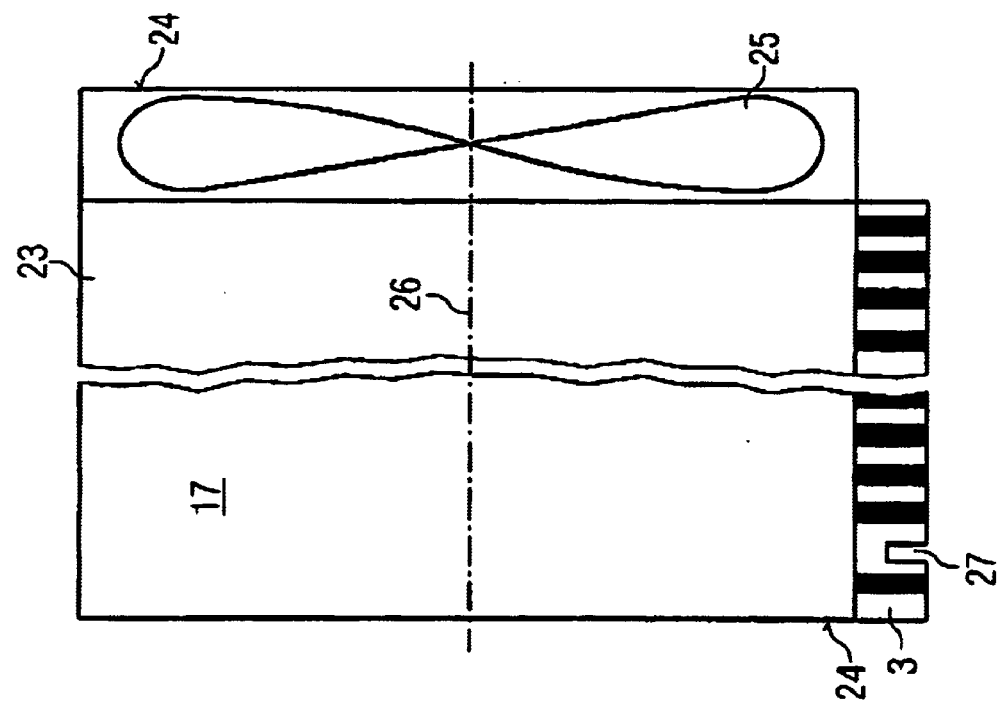
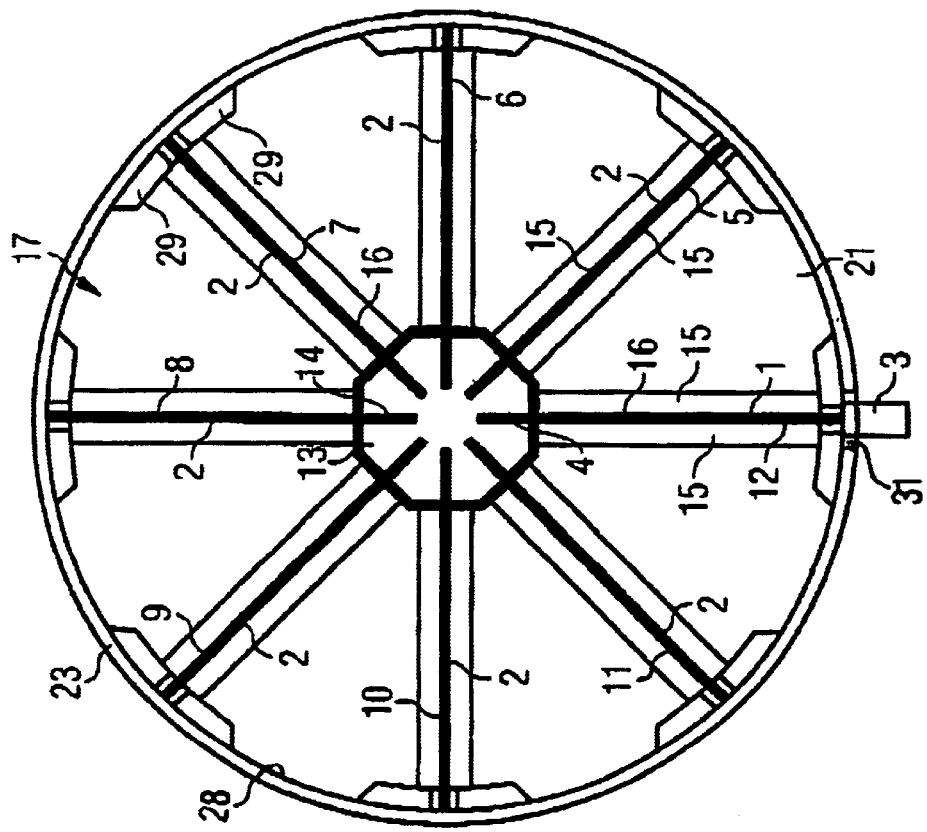

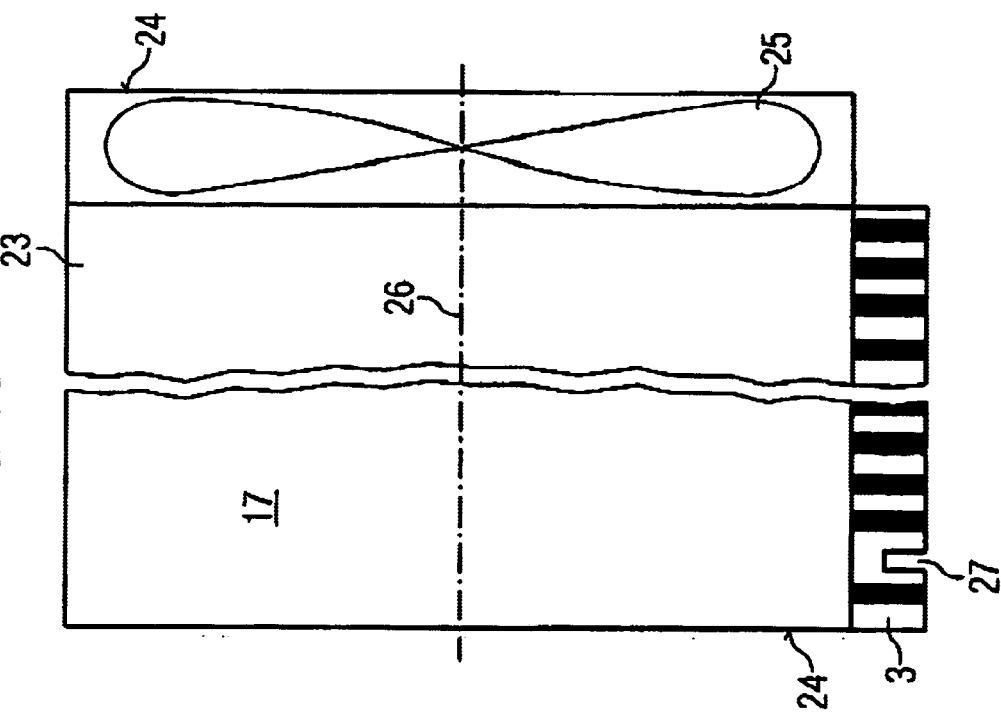
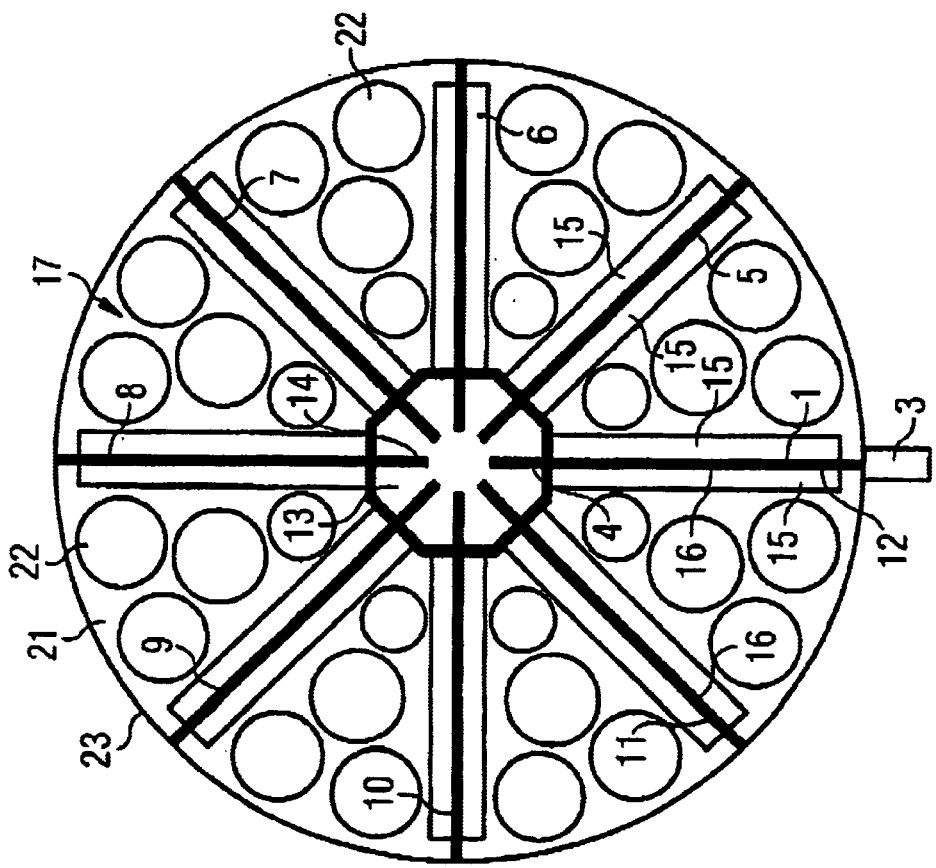

MODULE UNIT FOR MEMORY MODULES AND METHOD FOR ITS PRODUCTION

BACKGROUND OF THE INVENTION

1. Field of the Invention

The invention relates to a module unit for memory modules and to a method for producing the module unit.

Because of the increasing volume of data used by data processing systems and the limited space availability, the problem of storing extensive data for computing operations in limited spaces is becoming increasingly greater. It consequently appears to be necessary to further increase the density of memory modules in module units. However, increasing the density of memory modules in module units is limited by the available module area and also by the required area per individual component. In addition, the number of individual components per module in a module unit is likewise limited.

2. Summary of the Invention

It is accordingly an object of the invention to provide a module unit and a method for producing the module unit such that the limit on the storage capacity of the module unit is eliminated.

It is an additional object of the invention to provide a module unit principle that permits improved space utilization and that permits the storage capacity to be expanded to any desired extent.

With the foregoing and other objects in view there is provided, in accordance with the invention, a module unit, including: a plurality of memory modules including at least one main module and a plurality of submodules; and a central inner plug connector formed with radially aligned slots. The main module has opposing sides, an external outer contact strip, and an inner contact strip. The inner contact strip is configured in one of the radially aligned slots of the central inner plug connector. The plurality of the submodules is aligned in a star-shaped, radially aligned manner around the central inner plug connector. Each one of the plurality of the submodules has an end with a contact strip configured in a respective one of the radially aligned slots of the central inner plug connector.

This module unit has the advantage that, with the central inner plug connector, all of the submodules are connected to the main module by the shortest path. A close arrangement is obtained in this region and the lengths of the interconnects from the main module to the submodules are the same for each of the submodules. The main module may in this case include the entire evaluation logic or only part of it. The individual submodules may be assigned a wide variety of functions by providing the modules with components of a wide variety of forms. For instance, logic functions, memory functions or radio-frequency processing functions can be performed by correspondingly configuring the modules and by using the short and constant lengths of the interconnects between the main module and the submodules. Instead of submodules, submodule arrangements or units which have the same star-shaped and radial arrangement as the module unit may also be arranged in the slots of the central plug connector.

In the case of the inventive configuration of the module unit, the third dimension is used in an advantageous way to provide an arrangement of memory modules that is as dense as possible and that is nevertheless unlimited in a module arrangement. In this case, the radial arrangement around a central plug-in device is an effective solution, especially since short connecting lines with a high packing density can be achieved by the invention.

U.S. Pat. No. 5,812,797 shows a star-shaped arrangement of circuit boards (PCBs) that carry submodules of smaller dimensions. However, no central plug-in device is provided, and this leads to longer connecting lines.

The radial arrangement of individual elements in relation to a center is represented in U.S. Pat. No. 5,251,097. This concerns equipment cabinets in a computer installation, not memory modules.

U.S. Pat. No. 5,095,407 and U.S. Pat. No. 5,834,843 deal with placing chip modules against one another; a radially centered arrangement is not provided.

In a preferred embodiment of the invention, each memory module has at least one semiconductor chip. This semiconductor chip may be located on the same memory module as logic chips and radio-frequency chips or else passive components. It is advantageous if these components are configured using silicon planar technology, since the memory modules of the memory unit are then extremely flat and can be placed in the star-shaped arrangement in a space-saving manner.

A further embodiment of the invention provides that each memory module has a printed circuit board that is coated on both sides and that has semiconductor memory chips on both sides. This printed circuit board may have an edge region with a contact strip, and if it is the main module, one edge of the printed circuit board may have an outer contact strip that protrudes from the module board, and the other edge may have an inner contact strip that is arranged in one of the slots of the central plug connector.

In a further embodiment of the invention, the module unit has submodule units of the first, and second to nth orders. Submodule units of the first order can be attached at the locations of a submodule and have the same star-shaped structure of the module unit, but with smaller dimensions so that this star-shaped submodule unit fits into the slot of a submodule. Such a submodule unit of the first order can have submodules and/or additional submodule units of the second order, which can be introduced at slots of submodules in a submodule unit of the first order. In this way, as in a snowflake crystal structure, increasingly smaller submodule units of higher order can be inserted into the inventive module unit. Consequently, the advantage of a further increase in the module area with an increase in the storage density per module unit is possible with this embodiment of the invention.

In a further embodiment of the invention, eight slots are arranged in a distributed manner on the circumference of the central plug connector for memory modules or submodule units of the first order. One slot is provided for the main module. Such an embodiment of the invention has the advantage that an eight-pointed star with radially extending memory modules is formed. It is possible for half of the slots to be taken up by submodules or by submodule units that are adapted to the slot of a submodule. These form an eight-pointed star, but with smaller dimensions.

In a further embodiment of the invention, the module unit is packaged in a polymer molding compound forming a housing. This housing forms a cylinder having a lateral surface. The contact strip of the main module protrudes in the axial direction from this lateral surface. The radial construction provides optimum dissipation of the heat through the housing, which includes a polymer molding compound. This heat removal can be improved by using corresponding heat-conducting fillers, which may make up 50 to 80% of the volume of the polymer molding compound. In a further embodiment of the invention, tubular through-openings are arranged in the polymer molding compound between the memory modules parallel to the axial direction. In this embodiment of the invention, heat removal may take place by the chimney effect of the through-openings, if the cylindrical housing of a polymer molding compound is arranged vertically upright with the end faces left exposed.

In a further embodiment of the invention, the housing is not produced from plastic, but from a cylindrical tube in which the module unit is fastened. In this form of housing, in addition to the pure chimney effect, active cooling may also be carried out in the tubular housing by a cooling air stream that is produced by a cooling fan. In such an embodiment of the invention, the advantages of a star-shaped and radial construction are obvious, since uniform and intensive cooling is achieved.

For positioning the main module, the housing with the cylindrical tube may have a slit for receiving the outer contact strip of the main module. Furthermore, guide grooves may be provided in the inside wall of the tubular housing, in order to arrange the submodules in a star-shaped and radial manner in the tubular housing. The semiconductor chips provided for the main module, for the submodules and for the submodule units of the first to nth orders may be logic chips, memory chips, or radio-frequency chips. These chips are arranged on both sides of the printed circuit board of the respective main module, submodule, or on the printed circuit boards of the submodule units of the first to nth orders. Consequently, the module unit has a high degree of flexibility, not only in the sizes of the memory modules, but also in the storage density and in the type of components, which are beneficial for a wide variety of application purposes.

With the foregoing and other objects in view there is provided, in accordance with the invention, a method for producing a module unit. The method includes steps of:
producing a central plug connector having a circumference with slots distributed therein for contact strips of memory modules; providing at least one main module having an edge with an outer contact strip and an opposing edge with an inner contact strip; inserting the inner contact strip into one of the slots of the central plug connector so that the main module protrudes radially from the central plug connector; inserting submodules or submodule units into respective ones of the slots of the central plug connector; aligning the main module and the components in a star-shaped and radial manner; and packaging the main module, the components, and the central plug connector in a housing so that the outer contact strip of the main module protrudes from the housing.

This method advantageously has a relatively simple unit assembly, once the central plug connector has been produced. This is because the central plug connector has slots distributed on its circumference and the contact strips of the different memory modules can be inserted into these slots. Furthermore, the method is extremely variable, since both submodules and submodule units can be positioned in the slots. Finally, the method enables a simple and easily realizable housing to be formed. The basic cylindrical housing can be realized with polymer compounds by using relatively simple pressure molding processes.

For example, the module unit can be packaged into a housing by using an injection-molding technique. The module unit is embedded in a polymer molding compound, leaving the outer contact strip of the main module exposed. A further example includes forming elongate tubular, axially parallel through-openings in the polymer molding compound during packaging. This measure too, which serves substantially for improving the cooling of the module unit, can be realized with relatively inexpensive means.

In a further step of the method for producing the module unit, a cooling fan can be attached to one of the ends of the housing that has through-openings in the polymer molding compound. Active cooling provided by the air stream of the fan can then improve the cooling intensity. Furthermore, after producing through-openings from one end to the other, active cooling by liquids is also possible.

The module unit may also be packaged in a tubular housing. The end of the tubular housing remains open. A cooling fan may be provided on one end of the housing to intensify the cooling of the module unit. A cylindrical housing of this type, which receives the central plug connector and the radially aligned modules, may be produced from a plastic tube or a metal tube. For this application, the plastic tube may consist of a fiber-reinforced epoxy resin. A metal tube housing may be produced from aluminum, copper or brass and may additionally have cooling ribs which are outwardly directed or arranged on the inside wall.

To sum up, it can be stated that high-density memory modules are limited by two factors; on the one hand by the available module area, and on the other hand by the area required for individual components. Consequently, the number of individual components per module is limited. According to the invention, the available module area is now increased by the best possible volume utilization, and the electrical properties of the overall system are improved. Consequently, stacked packages can be used to obtain a component level with third dimension, and the module area is also increased. At the same time, relatively short interconnects between the main module and the submodule are achieved. This produces a dense arrangement. The radial arrangement is the most effective way of achieving a high packing density and short interconnects. Accordingly, the invention arranges a plurality of submodules around a main module. A central plug connector provides the connection from one printed circuit board to the other printed circuit board of the memory module in a very restricted space. In this case, the lengths of the interconnects from the main module to the submodules are all the same. The main module may include the entire evaluation logic or else only parts of it, and the individual submodules may be assigned a wide variety of tasks. Furthermore, the radial arrangement can be constantly repeated in the case of corresponding submodule units.

Other features which are considered as characteristic for the invention are set forth in the appended claims.

Although the invention is illustrated and described herein as embodied in a module unit for memory modules and method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic plan view of a first embodiment of a module unit;

FIG. 2 is a schematic side view of the first embodiment of the module unit;

FIG. 5 is a schematic plan view of a third embodiment of a module unit;

FIG. 6 is a schematic side view of the third embodiment of the module unit;

FIG. 7 is a schematic plan view of a fourth embodiment of a module unit;

FIG. 8 is a schematic side view of the fourth embodiment of the module unit;

FIG. 9 is a schematic plan view of a fifth embodiment of a module unit; and

FIG. 10 is a schematic side view of the fifth embodiment of the module unit.

DESCRIPTION OF THE PREFERRED EMBODIMENTS

Figure 4:
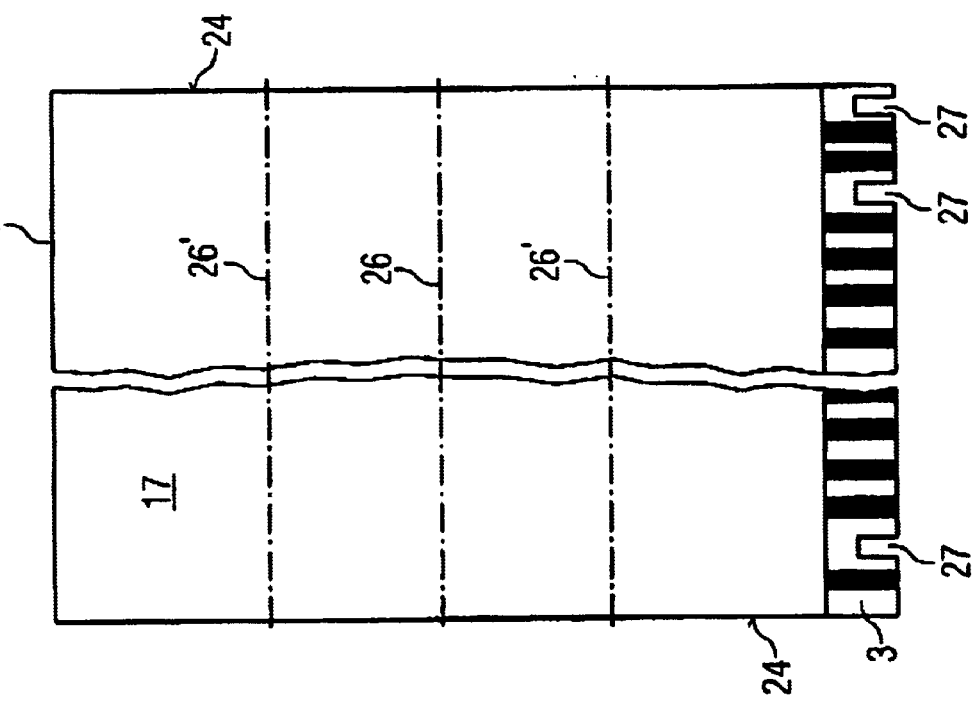
FIG. 4 is a schematic side view of the second embodiment of the module unit.

Referring now to the figures of the drawing in detail and first, particularly, to FIG. 1 thereof, there is shown a schematic plan view of a first embodiment of a module unit 17. The module unit of FIG. 1 substantially includes memory modules. The reference numeral 1 identifies a main module with an outer contact strip 3, which protrudes from the housing 23 of the module unit 17. The main module 1 also has an inner contact strip 4, which is arranged in a slot 12 of a central inner plug connector 13. The reference numeral 2 designates submodules, which are radially aligned and arranged in a star-shaped manner around the central inner plug connector 13. Each of the submodules has one end with a contact strip 14. The submodules 2 occupy the remaining slots 5 to 11 of the central plug connector 13. In this first embodiment of the invention, each memory module (1 and 2) has a printed circuit board 16 that is coated on both sides and that is loaded on both sides. The printed circuit boards 16 may be loaded with logic chips, memory chips, radio-frequency components, and/or passive components.

The submodules 2 are connected to the main module 1 via the central plug connector 13, so that connecting lines to the main module 1 that each have the same length are obtained for all of the submodules 2. In the embodiment shown in FIG. 1, the central plug connector 13 has slots 5 to 12 distributed on the circumference. The number of slots can be increased or doubled at any time and is dependent only on the size of the circumference or the size of the lateral surface of the central plug connector 13 and the space requirement for each slot. The radial construction of the module unit provides the advantage of compact space utilization and at the same time enables the module unit to be intensively cooled. This possibility for cooling can be produced by embedding the module unit 17 in a polymer molding compound serving as a housing. The polymer molding compound is filled with a heat-conducting filler of the order of magnitude of 50 to 80% by volume.

FIG. 2 is a schematic side view of the module unit 17 shown in FIG. 1. Components with the same functions as in FIG. 1 are designated by the same reference numerals and are not separately explained.

The module unit 17 forms a cylindrical housing 23 with a central axis 26, in which the central plug connector 13 is arranged of the contact strips of the modules, the only one protruding from the housing is the contact strip 3 of the main module 1. The contact strip 3 of the main module 1 is positionally coded by providing clearances 27. In this first embodiment, the length of the cylindrical housing is 30 to 150 mm and the diameter of the module unit is around 50 to 100 mm.

Figure 3:
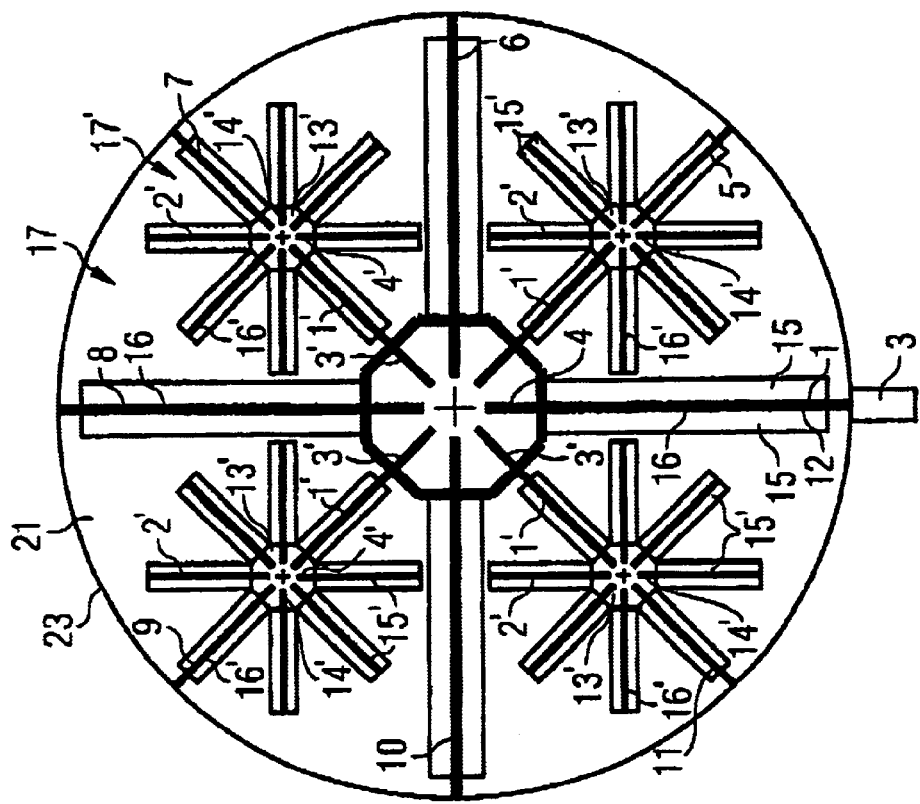
FIG. 3 is a schematic plan view of a second embodiment of a module unit.

FIG. 3 shows a schematic plan view of a second embodiment of the module unit 17. Components with the same function as in the previous figures are designated by the same reference numerals and are not separately explained.

The module unit 17 of this second embodiment of the invention is of a similar construction to that of the first embodiment and, like the first embodiment, has slots 5 to 12. A main module 1 is arranged in the slot 12 and a respective submodule 2 is arranged in the slots 6, 8 and 10. These memory modules are also provided with printed circuit boards 16 that are coated on both sides and loaded on both sides. Instead of arranging a submodule 2 in each of the slots 5, 7, 9 and 11 there is a submodule unit 17' arranged in each of those slots 5, 7, 9, and 11. Each submodule unit 17' includes a main module 1' and corresponding submodules 2'. The radial construction of the submodule units 17' of the first order corresponds to the star-shaped construction of the module unit 17, but the circuit boards 16' have smaller dimensions so that the submodule unit 17' of the first order can be arranged at corresponding slots of the submodules 2. In the second embodiment, the volume density is further increased and it is possible for chips with different functions and with different sizes to be combined in the module unit 17.

FIG. 4 is a schematic side view of the module unit 17 shown in FIG. 3. Components with the same functions as in the previous figures are designated by the same reference numerals and are not separately explained.

The schematic side view of the second embodiment of the module unit 17 does not differ from the schematic side view of the first embodiment shown in FIG. 2. The housing 23 may again be a polymer molding compound 21, which embeds the entire module unit having the main module 1, the submodules 2 and the submodule units 17' in a cylindrical form, so that only the contact strip 3 with the coded clearances 27 protrudes on one side from the housing 23. Instead of embedding the module unit in a polymer molding compound having corresponding filling materials to improve the heat conduction, in this embodiment it is also possible to provide the housing 23 as a tubular housing having corresponding fastening grooves on the inside wall of the tube. The central plug connector 13 will be arranged within the tubular housing on the main axis 26 of the tubular housing and the central plug connectors 13' of the submodule units 17' will be placed on the secondary axes 26' of the tubular housing. The tubular housing has the advantage that the ends are open, and in the case of a vertical arrangement of the axis 26, active cooling can be achieved by convection or a chimney effect alone. This active cooling can be further intensified by fitting a cooling fan on one of the ends 24 of the housing 23.

FIG. 5 shows a schematic plan view of a third embodiment of a module unit 17. Components with the same functions as in the previous figures are designated by the same reference numerals and are not separately explained.

While the reference numeral 1 designates a main module of the module unit 17, the designation 1' is used to designate a main module of a submodule unit 17' of the first order and the designation 1" is used to designate a main module of a submodule unit 17" of the second order. This structuring can be continued up to an nth order. The star-shaped and radially aligned arrangement is retained, while the dimensions are reduced with each higher order in a corresponding way. In the third embodiment, which is shown in FIG. 5, three module units are nested one inside the other, so that a central plug connector 13 is arranged on the central axis 26, while four further plug connectors 13' are arranged on the secondary axes 26' and sixteen further plug connectors 13" are respectively arranged on the axes 26".

By receiving submodule units 17" of the second order, the storage density within the module unit 17 is further increased.

FIG. 6 is a schematic side view of the module unit shown in FIG. 5. Components that perform the same function as in the following figures are designated by the same reference numerals and are not separately explained.

In FIG. 6, the main axis 26 of the central plug connector 13 is marked by a dash-dotted line. The axes 26' of the central plug connectors 13' of the submodule units 17' of the first order are marked by a double dot-dash line. Finally, the axis 26" of the central plug connector 13" of the submodule unit 17" of the second order is shown by a triple-dot-dashed line. As FIG. 3 shows, only the contact strip 3 of the main module 1 protrudes from the entire module unit 17, while the main modules 1' and 2' of the corresponding submodule units 17' and 17" remain arranged within the housing and are arranged in the respective plug connectors 13' and 13". The housing 23 may be a solid plastic housing, as in the first and second embodiments, so that the module unit 17 with its submodule units 17' and 17" are embedded in a polymer molding compound 21. The housing 23 of the third embodiment may also be a tubular housing, into which the module unit 17 with its submodule units 17' and 17" are inserted, so that corresponding cooling air convection by vertical arrangement or else forced cooling can improve the lost-heat dissipation of the memory modules.

FIG. 7 shows a schematic plan view of a fourth embodiment of the module unit. Components with the same functions as those in the previous figures are designated by the same reference numerals and are not separately explained.

In the fourth embodiment of the module unit, a tubular housing 23 has an inner side 28 with guide elements 29. Two guide elements 29 are respectively spaced apart in such a manner that the edge of a printed circuit board 16 of one of the memory modules can be positioned in between. In a corresponding manner, the guide elements 29 may be formed such that they extend over the full length of the housing 23 or such that they are distributed over the length of the housing as guide studs, in order to guide the printed circuit boards 16 in their star-shaped position on the inner side 28 of the housing 23. Another possible way of fixing and positioning the printed circuit boards 16 in the tubular housing 23 is to make grooves in the inner side 28, which can serve as guide grooves for the printed circuit boards 16. Since the outer contact strip 3 of the main module 1 protrudes from the tubular housing, a slit-shaped opening 31 is provided in the tubular housing for the printed circuit board 16 that has the outer contact strip 3. The contact strip 3 protrudes outward from the housing 23 through this slit-shaped opening 31.

The fourth embodiment of the invention has the advantage that, with the axis 26 or the central plug connector 13 arranged vertically, the tubular housing 23 removes the lost heat of the memory modules by a chimney effect. Should this chimney effect not be adequate, a cooling fan 25 may be additionally arranged on one of the ends 24 of the tubular housing 23.

FIG. 8 is a schematic side view of the module unit 17 shown in FIG. 7. Components that perform the same functions as those in the previous figures are designated by the same reference numerals and are not separately explained.

The side view of the fourth embodiment of the invention differs from the side views of FIGS. 2, 4 and 6 in that a cooling fan 25 is arranged on one end 24 of the tubular housing 23. The cooling fan 25 provides active cooling of the fourth embodiment of the module unit. A fan rotor rotates about the axis 26 of the module unit.

FIG. 9 is a schematic plan view of a fifth embodiment of the module unit 17. Components with the same functions as those in the previous figures are designated by the same reference numerals and are not separately explained.

The fifth embodiment of the module unit 17 is embedded in a polymer molding compound 21 that forms a cylindrical housing 23. Through-openings 22 are arranged in the molding compound 21 between the main module 1 and the submodules 2. These through-openings 22 extend parallel to the housing axis 26 and remain open at the ends 24. Using a vertical arrangement of the axis 26 and the central plug connector 13, the through-openings 22 enable a chimney effect to be obtained and consequently bring about an improved cooling of the polymer molding compound 21. This active cooling of the polymer molding compound 21 can be additionally improved by a filler that increases the thermal conductivity of the polymer molding compound. In addition, a cooling fan 25 may be attached on one of the ends 24 of the housing 23.

FIG. 10 shows a schematic side view of the fifth embodiment of the module unit 17. Components with the same functions as those in the previous figures are designated by the same reference numerals and are not separately explained.

FIG. 10 shows a schematic side view that differs from the schematic side views of FIGS. 2, 4 and 6 in that a cooling fan 25, which can force cooling air through the through-openings 22 of the housing 23, is arranged on an end 24 of the housing 23 of the module unit 17. Instead of the cooling fan, a supply line and discharge line for a cooling liquid may also be arranged on the ends 24 of the housing 23, in order to enable a more intensive hydro-cooling, which is directed through the through-openings 22.

I claim:

1. A module unit, comprising:

a plurality of memory modules including at least one main module and a plurality of submodules; and a central inner plug connector formed with radially aligned slots;

said main module having opposing sides, an external outer contact strip, and an inner contact strip;

said inner contact strip being configured in one of said radially aligned slots of said central inner plug connector;

said plurality of said submodules being aligned in a star-shaped, radially aligned manner around said central inner plug connector; and each one of said plurality of said submodules having an end with a contact strip configured in a respective one of said radially aligned slots of said central inner plug connector.

2. The module unit according to claim 1, wherein:

each one of plurality of said memory modules includes at least one semiconductor memory chip.

3. The module unit according to claim 1, wherein:

each one of plurality of said memory modules includes a printed circuit board with opposing sides that are each coated and that each have semiconductor memory chips.

4. The module unit according to claim 1, comprising:

submodule units of a first order; and submodule units of a second order nested in said submodule units of the first order.

5. The module unit according to claim 4, comprising:

submodule units of an $n^{th}$ order nested in said submodule units of the second order.

6. The module unit according to claim 4, wherein:

said submodule units of the first order are constructed in a star-shaped and radial manner; and said submodule units of the second order are constructed in a star-shaped and radial manner.

7. The module unit according to claim 6, wherein:

said plurality of said submodules have dimensions and define positions;

said submodule units of the first order are arranged at said positions of said plurality of said submodules; and said submodule units of the first order have dimensions adapted to said dimensions of said plurality of said submodules.

8. The module unit according to claim 1, wherein:

said central plug connector has a circumference; and said radially aligned slots define eight slots configured in a distributed manner on said circumference of said central plug connector.

9. The module unit according to claim 1, comprising: a housing formed by a polymer molding compound.

10. The module unit according to claim 1, comprising:

a polymer molding compound formed with tubular through-openings extending an axial direction;

said tubular through-openings formed between said plurality of said memory modules.

11. The module unit according to claim 1, comprising:

a cylindrical housing securing said plurality of said memory modules, said housing having an end; and a fan configured at said end of said housing.

12. The module unit according to claim 1, wherein:

each of said plurality of said memory modules has a printed circuit board with different semiconductor chips; and said semiconductor chips are selected from the group consisting of logic chips, memory chips, and radio-frequency chips.

13. A method for producing a module unit, the method which comprises:

producing a central plug connector having a circumference with slots distributed therein for contact strips of memory modules;

providing at least one main module having an edge with an outer contact strip and an opposing edge with an inner contact strip;

inserting the inner contact strip into one of the slots of the central plug connector so that the main module protrudes radially from the central plug connector;

inserting components, selected from the group consisting of submodules and submodule units, into respective ones of the slots of the central plug connector;

aligning the main module and the components in a star-shaped and radial manner; and packaging the main module, the components, and the central plug connector in a housing so that the outer contact strip of the main module protrudes from the housing.

14. The method according to claim 12, which comprises:

using an injection-molding technique to perform the packaging such that the main module, the components, and the central plug connector are embedded in a polymer molding compound and such that the outer contact strip of the main module is exposed.

15. The method according to claim 14, which comprises:

obtaining a packaged module unit as a result of the packaging; and configuring a cooling fan at one end of the packaged module unit.

16. The method according to claim 14, which comprises:

during the packaging, forming elongate tubular, axially parallel through-openings in the polymer molding compound.

17. The method according to claim 16, which comprises:

obtaining a packaged module unit as a result of the packaging; and configuring a cooling fan at one end of the packaged module unit.

18. The method according to claim 13, which comprises:

providing a cylindrical tubular housing having an end with a cooling fan; and before the packaging, fitting the main module, the components, and the central plug connector into the tubular housing.

* * * * *